Oct. 10, 1950 H. BLOK 2,525,394
HETERODYNE RECEIVER CIRCUIT
Filed Feb. 12, 1947
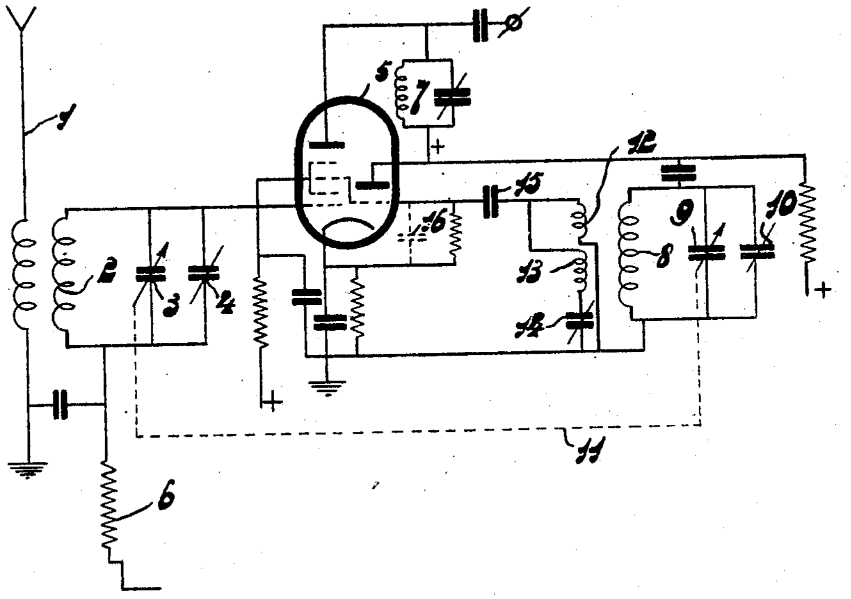
HENRI BLOK
INVENTOR
BY Fred M Vogel
AGENT Patented Oct. 10, 1950 2,525,394

UNITED STATES PATENT OFFICE 2,525,394

HETERODYNE RECEIVER CIRCUIT

Henri Blok, Eindhoven, Netherlands, assignor to Hartford National Bank and Trust Company, Hartford, Conn., as trustee Application February 12, 1947, Serial No. 728,074
In the Netherlands August 19, 1944

Section 1, Public Law 690, August 8, 1946
Patent expires August 19, 1964

3 Claims. (Cl. 250—20)

This invention relates to a device for the simultaneous tuning of an oscillatory circuit associated with an oscillator and of one or more other oscillatory circuits by means of identical ganged tuning condensers, the tuning frequency of the oscillator tank circuit differing by a substantially constant amount from that of the other circuits, said device being especially suitable for superheterodyne receivers.

It is known that in these devices use can be made of an oscillator which includes an inductive feedback comprising two feedback coils, one of which is connected in series with a condenser and which has a natural frequency higher than the maximum frequency to be generated, whereas the other has an inductance value higher than the inductance value of the coil used in the oscillator tank circuit. Such a double feedback may be used with advantage when tuning in the short wave band, since otherwise the oscillator voltage drops excessively at the lowest frequencies of the said band. In the case of short wave receivers, it should be possible to tune throughout the comparatively wide frequency band. The use of a supplementary feedback coil having a comparatively high conductance prevents the oscillator voltage dropping at lower frequencies.

In the well-known devices for simultaneously tuning an oscillator tank circuit and one or more other circuits, the desired constant difference in tuning frequency is frequently ensured by mounting a so-called padding condenser in series with the tuning condenser or with the inductance coil of the oscillator tank circuit. The capacity of this padding condenser is usually high compared with the maximum capacity of the tuning condenser. With superheterodyne receivers having an intermediate frequency of about 450 kilocycles/sec., for example with short-wave receivers, a padding condenser having a capacity of the order of 5,000 mmf. will be needed in the oscillator tank circuit. In order to enable reliable calibration of the tuning dial, and to permit the desired difference in tuning frequency being maintained at the same time, it is necessary that the capacity of the padding condenser should remain constant within very narrow limits; more particularly this capacity should only vary to a slight extent with the temperature. This leads to the use of high quality condensers, particularly of mica condensers. The cost of suitable mica condensers is, however, high because of the high capacity and narrow tolerance requirements.

The invention is based on recognition of the fact that, in the above-mentioned devices, it is possible to ensure the desired constant frequency difference without the necessity of using a padding condenser.

According to the invention, the desired substantially constant difference in tuning frequency is attained by correct proportioning of the said series condenser, the feedback coils and the couplings between the oscillator tank circuit and the feedback coils.

As a matter of fact, the said high inductance feedback coil induces a series capacity in the oscillatory circuit of the oscillator. Thus, by suitable proportioning of the said quantities it can be ensured that the said induced capacity is given a value equal to that of a suitable padding condenser.

The series condenser is preferably constructed to be variable (thus constituting a trimmer condenser); adjustment of this condenser allows the desired value of the induced series capacity to be attained. In practice it is found to be very desirable for the condenser to be so arranged as to be unilaterally connected, at least so far as high frequency oscillations are concerned directly to a point of constant potential (earth), since otherwise trimming can be effected with difficulty only.

In order that the invention may be clearly understood and readily carried into effect it will now be described more fully with reference to the accompanying drawing, in which the single figure of the drawing illustrates a portion of a superheterodyne receiver embodying the invention.

The single figure of the drawing shows a portion of a superheterodyne receiver, the signal oscillations of an aerial 1 being transmitted inductively to an input oscillatory circuit which is constituted by an inductance coil 2, a tuning condenser 3 and a trimmer 4 and which is included in the circuit of the first control grid of the hexode part of a triode-hexode 5. This control grid has supplied to it in the usual manner via a resistance 6 a control voltage for automatic volume control. The intermediate frequency oscillations generated by mixing the signal oscillations and the local oscillations generated in the triode path of the discharge tube 5 may be obtained from an intermediate frequency circuit 7 included in the anode circuit of the hexode part.

For the generation of the local oscillations the anode circuit of the triode part includes an oscillator tank circuit constituted by an inductance coil 8, a tuning condenser 9 and a trimmer condenser 10, the tuning condenser 9 being equal to the tuning condenser 3 of the input oscillatory circuit and being mechanically coupled to it, as is diagrammatically indicated by a dotted line 11.

The control grid circuit of the triode includes two parallel-connected feedback coils 12 and 13, the latter feedback coil having a condenser 14 connected in series with it.

The parallel combination of the two feedback coils is connected to the control grid of the triode through a grid condenser 15. The grid-cathode capacity of the triode is represented by a condenser 16 shown in dotted lines. The feedback coil 13 is identical with the feedback coil which is normally provided and whose inductance is about a quarter of the inductance of the coil 8. The natural frequency of this feedback coil lies outside the frequency band of the oscillations to be generated on the side of the high frequencies. The disadvantage of circuits in which but one feedback coil is used arises from the fact that the value of the oscillator voltage drops strongly during the generation of the lower frequencies. In order to improve this, provision is made for a second feedback coil 12 whose inductance is high compared with that of the coil 8, for example ten times as large. This coil jointly with the coil 13, the condenser 14, the blocking condenser 15 and the internal tube capacity 16 constitutes a circuit whose natural frequency also lies outside the frequency band of the oscillations to be generated but now on the side of the low frequencies. The resonant frequency of the circuit is, however, so close to the band of the frequencies to be generated that the voltages obtained from the oscillator tank circuit are swung up to such extent that even so far as the low frequencies of the frequency band involved are concerned a sufficiently high voltage of the oscillator frequency is set up across the grid of the triode.

According to the invention, in order to ensure a constant difference between the tuning frequency of the oscillator tank circuit and that of the input oscillatory circuit. the series condenser 14, the feedback coils and the couplings between the coils 8, 12 and 13 are proportioned in such manner that the series capacity induced in the oscillator tank circuit has that value which would be required of a padding condenser used in the oscillator tank circuit for maintaining, at least approximately, the above mentioned frequency difference.

The value of the induced series capacity may be adjusted by replacing the condenser 14 by a trimming condenser. In order that it may be possible for the trimming of this condenser to be carried out in practice, this condenser is connected directly to earth.

The above described circuit arrangement permits, without the use of a padding condenser, the attainment of a padding curve which is substantially the same as the curve which would be obtained with the use of a fixed padding condenser.

If the circuit according to the invention is contrasted with a circuit in which a padding condenser is not used, it has the advantage of enabling the oscillator to be trimmed on the side of the low frequencies without supplementary cost thus ensuring a considerable improvement in the accuracy of the dial.

In a receiver comprising two or more wave bands, the coils 8, 12 and 13 and the condenser 14 are jointly cut out when passing to a further waveband; in this case they may be replaced by a further set of corresponding circuit elements.

What I claim is:

1. In a superheterodyne receiver arrangement tunable over a given range of input signal frequencies, a local oscillator circuit, comprising an electron discharge system having cathode, input and output electrodes, an oscillatory circuit coupled between said cathode and output electrodes and including a first inductive element having a given inductance value and a variable capacitive element to tune said first oscillatory circuit over a given range of local oscillation frequencies, second and third inductive elements inductively coupled to said first inductive element in regenerative relationship in said range of local oscillation frequencies, said second inductive element having an inductance value greater than the inductance value of said first inductive element and said third inductive element having a natural resonant frequency higher than the frequencies of said given range of local oscillation frequencies, a capacitive element coupled in series with said third inductive element, circuit means to couple said second inductive element and the series combination of said third inductive element and said capacitive element in parallel between said cathode and said input electrode, and means to simultaneously adjust the tuning of said receiver arrangement with respect to said signal frequencies and the tuning of said oscillatory circuit with respect to said local oscillation frequencies to produce an intermediate frequency signal in said receiver, said second and third inductive elements, said capacitive element and said circuit means constituting elements of a resonant circuit tuned to a frequency lower than the frequencies of said given range of local oscillation frequencies.

2. In a superheterodyne receiver arrangement tunable over a given range of input signal frequencies, a local oscillator circuit, comprising an electron discharge system having cathode, grid and anode electrodes, an oscillatory circuit coupled between said cathode and said anode and including a first inductive element having a given inductance value and a first variable capacitive element to tune said oscillatory circuit over a given range of local oscillation frequencies, second and third inductive elements inductively coupled to said first inductive element in regenerative relationship in said range of local oscillation frequencies, said second inductive element having an inductance value greater than the inductance value of said first inductive element and said third inductive element having a natural resonant frequency higher than the frequencies of said given range of local oscillation frequencies, a second variable capacitive element coupled in series with said third inductive element, circuit means including a capacitor to couple said second inductive element and the series combination of said third inductive element and said second variable capacitive element in parallel between said cathode and said grid, and means to simultaneously adjust the tuning of said receiver arrangement with respect to said signal frequencies and the tuning of said oscillatory circuit with respect to said local oscillation frequencies to produce an intermediate frequency signal in said receiver, said second and third inductive elements, said second variable capacitive element and said circuit means constituting elements of a resonant circuit tuned to a frequency lower than the frequencies of said given range of local oscillation frequencies.

3. In a superheterodyne receiver arrangement tunable over a given range of input signal frequencies by means of a first variable tuning capacitor, a local oscillator circuit, comprising an electron discharge system having cathode, grid and anode electrodes, a tank circuit coupled between said cathode and anode electrodes and including a first inductive element having a given inductance value and a second variable capacitive element to tune said tank circuit over a given range of local oscillation frequencies, second and third inductive elements inductively coupled to said first inductive element in regenerative relationship in said range of local oscillation frequencies, said second inductive element having an inductance value greater than the inductance of said first inductive element and said third inductive element having a natural resonant frequency higher than the frequencies of said given range of local oscillation frequencies, a third variable capacitive element coupled in series with said third inductive element, circuit means to couple said second inductive element and the series combination of said third inductive element and said third variable capacitive element in parallel between said cathode and said grid electrode, and means to simultaneously adjust the capacitive values of said first and second variable capacitive elements to thereby adjust the tuning of said receiver arrangement with respect to said signal frequencies and the tuning of said tank circuit with respect to said local oscillation frequencies to produce an intermediate frequency signal in said receiver, said second and third inductive elements, said third variable capacitive element and said circuit means constituting elements of a resonant circuit tuned to a frequency lower than the frequencies of said given range of local oscillation frequencies.

HENRI BLOK.

REFERENCES CITED

The following references are of record in the file of this patent:

UNITED STATES PATENTS

| Number | Name | Date |
|---|---|---|
| 2,027,986 | Kinross | Jan. 14, 1936 |
| 2,061,991 | Wheeler | Nov. 24, 1936 |
| 2,200,498 | Haantjes et al. | May 14, 1940 |
| 2,231,389 | Koffyberg | Feb. 11, 1941 |
| 2,404,669 | Tillman | July 23, 1946 |
| 2,439,286 | Crosby | Apr. 6, 1948 |

FOREIGN PATENTS

| Number | Country | Date |
|---|---|---|
| 447,104 | Great Britain | May 12, 1936 |
| 364,048 | Italy | Oct. 20, 1938 |